(12) United States Patent
Fordham et al.

(10) Patent No.: US 9,992,896 B2
(45) Date of Patent: Jun. 5, 2018

(54) DETACHABLE CRANK AND SLIDER CIRCUIT PACK EJECTOR

(71) Applicant: FLEXTRONICS AP, LLC., Broomfield, CO (US)

(72) Inventors: Mark Fordham, Chapel Hill, NC (US); Rick Payne, Plano, TX (US)

(73) Assignee: FLEXTRONICS AP, LLC, San Jose, CA (US)

(*) Notice: Subject to any disclaimer, the term of this patent is extended or adjusted under 35 U.S.C. 154(b) by 193 days.

(21) Appl. No.: 14/447,219

(22) Filed: Jul. 30, 2014

(65) Prior Publication Data
US 2015/0181744 A1 Jun. 25, 2015

Related U.S. Application Data

(60) Provisional application No. 61/919,429, filed on Dec. 20, 2013.

(51) Int. Cl.
| | |
|---|---|
| *H05K 7/14* | (2006.01) |
| *G06F 1/18* | (2006.01) |
| *H01R 12/70* | (2011.01) |
| *H01R 13/629* | (2006.01) |

(52) U.S. Cl.
CPC .......... *H05K 7/1409* (2013.01); *G06F 1/186* (2013.01); *H01R 12/7005* (2013.01); *H01R 13/629* (2013.01); *Y10T 74/18944* (2015.01)

(58) Field of Classification Search
CPC ............ H01R 12/7005; H01R 12/7058; H01R 13/62927; H01R 13/62933; H01R 13/62938; H01R 13/62955; H05K 7/12; H05K 7/1401; H05K 7/1402; H05K 7/1409; H05K 7/1411; H05K 7/1417; H05K 7/1431; H05K 7/1451; H05K 7/1489; H05K 7/16; H05K 1/148; H05K 5/0221; H05K 5/0226; G06F 1/183; G06F 1/184; G06F 1/185; G06F 1/186; Y10T 74/18944;
(Continued)

(56) References Cited

U.S. PATENT DOCUMENTS

| | | | | | |
|---|---|---|---|---|---|
| 2,302,661 | A | * | 11/1942 | Benson | ..................... E05D 1/04 16/267 |
| 2,712,955 | A | * | 7/1955 | Andrews | ............... E05C 19/145 244/129.4 |

(Continued)

FOREIGN PATENT DOCUMENTS

EP 0323926 A1 7/1989

*Primary Examiner* — William C Joyce
(74) *Attorney, Agent, or Firm* — Volpe and Koenig, P.C.

(57) ABSTRACT

A mechanism for connecting a first object, such as a chassis and/or motherboard, to a second object, such as a faceplate and/or daughterboard. A first link may be connected to the first object and a second link may be connected to the second object. The second link may have a slot and the first link may have a pin which is releasably connectable to the slot to form a pivot connecting the first link to the second link. The pin may be releasable from the slot at a first point of travel of the pivot and the pin may not be releasable from the slot at a second point of travel of the pivot. The first link may include a first retaining lobe and the second link may include a second retaining lobe disposed to interlock with the first retaining lobe.

23 Claims, 14 Drawing Sheets

(58) Field of Classification Search
CPC .......... Y10T 74/18912; Y10T 74/1892; Y10T 74/18928; Y10T 74/18936
USPC .......... 74/38, 40, 42, 44, 45, 48, 49, 68, 69, 74/104, 105; 361/679.43, 679.58, 747, 361/759, 801; 16/230, 231, 258, 371; 403/20, 116, 321, 326, 322.4; 439/157, 439/160, 298, 437, 352, 140, 270, 372, 439/744, 818, 822, 846, 848, 871; 24/270, 273
See application file for complete search history.

(56) References Cited

U.S. PATENT DOCUMENTS

| | | | | |
|---|---|---|---|---|
| 2,821,359 A * | 1/1958 | Bushnell | ............... | B60P 7/0838 24/270 |
| 2,947,514 A * | 8/1960 | Goss | ................... | A01G 23/003 24/270 |
| 3,311,863 A * | 3/1967 | Beale | ................... | H05K 7/1409 361/798 |
| 3,333,726 A * | 8/1967 | Belanger | ............... | E05D 7/1072 16/257 |
| 4,295,287 A * | 10/1981 | Natzke | ................. | E02F 3/3622 403/316 |
| 4,914,550 A * | 4/1990 | Filsinger | ............. | H05K 7/1409 361/715 |
| 4,931,907 A * | 6/1990 | Robinson | ............ | H05K 7/1411 200/50.06 |
| 4,991,818 A * | 2/1991 | Darbo | ................. | H05K 7/1411 248/681 |
| 5,030,108 A | 7/1991 | Babow et al. | | |
| 5,052,952 A * | 10/1991 | Lawson | ............ | H01H 85/0208 439/160 |
| 5,077,722 A * | 12/1991 | Geist | ................... | G11B 33/121 360/137 |
| 5,257,942 A * | 11/1993 | Taguchi | ........... | H01R 13/62938 439/153 |
| 5,320,544 A * | 6/1994 | Naoto | ............... | H01R 13/62938 439/157 |
| 5,395,248 A * | 3/1995 | Kinoshita | .............. | H01R 23/72 439/31 |
| 5,644,470 A * | 7/1997 | Benedict | ................ | G06F 1/184 361/679.32 |
| 6,160,717 A | 12/2000 | Desousa et al. | | |
| 6,406,312 B1 | 6/2002 | Heitkamp | | |
| 6,443,315 B1 * | 9/2002 | Tabuchi | ............... | H05K 7/1409 211/26 |
| 6,447,312 B1 * | 9/2002 | Takata | ............ | H01R 13/62938 439/157 |
| 6,623,286 B2 * | 9/2003 | Tachi | ............... | H01R 13/62938 439/157 |
| 6,666,697 B2 * | 12/2003 | Yamashita | ....... | H01R 13/62977 439/152 |
| 6,953,232 B2 * | 10/2005 | Busby | .................... | A47B 81/06 292/196 |
| 7,013,530 B2 * | 3/2006 | Lallemant | ............. | G06F 1/1616 16/260 |
| 7,354,293 B2 * | 4/2008 | Liang | .................... | H05K 7/1411 361/727 |
| 7,397,674 B2 * | 7/2008 | Schlack | ............... | H05K 7/1409 361/754 |
| 8,310,834 B2 * | 11/2012 | Furholzer | .............. | H02B 1/052 361/747 |
| 8,593,827 B1 * | 11/2013 | Lewis | .................... | H05K 7/1411 361/801 |
| 9,260,898 B2 * | 2/2016 | Soma | ................ | H01R 13/5213 |
| 9,509,073 B2 * | 11/2016 | Hsu | .................... | H01R 12/7076 |
| 2015/0300063 A1 * | 10/2015 | Soma | ..................... | E05D 3/022 16/232 |
| 2015/0349442 A1 * | 12/2015 | Hsu | .................... | H01R 12/7076 439/68 |

* cited by examiner

DETACHABLE CRANK AND SLIDER CIRCUIT PACK EJECTOR

CROSS REFERENCE TO RELATED APPLICATION

This application claims the benefit of U.S. Provisional Application No. 61/919,429, filed Dec. 20, 2013, which is incorporated by reference as if fully set forth.

FIELD OF INVENTION

The invention generally relates to latching mechanisms. In particular, the invention relates to crank and slider type insertion and ejection mechanisms.

BACKGROUND

In computer hardware and other electrical applications, modular circuit components may be provided in order to facilitate upgrade and repair. For example, a typical personal computer may have a motherboard containing various system components to which a daughterboard may be attached which may contain additional hardware for expanding memory, graphics processing capability, or other functionality. Daughterboards are usually connected to the motherboard by manual insertion using an edge connector.

Other types of computing and electrical equipment, such as blade servers and circuit breaker panels, may also incorporate modularity by providing a modular component such as a blade, circuit pack, or circuit breaker for insertion into a housing such as a server enclosure or chassis. Such modular components may be connected using edge, pin, or other electrical connectors as appropriate.

However inserting high pin count connectors may be difficult due to frictional forces and delicate components may be damaged by improper insertion.

SUMMARY

A mechanism for connecting a first object, such as a chassis and/or motherboard, to a second object, such as a faceplate and/or daughterboard. A first link may be connected to the first object and a second link may be connected to the second object. The second link may have a slot and the first link may have a pin which is releasably connectable to the slot to form a pivot connecting the first link to the second link. The pin may be releasable from the slot at a first point of travel of the pivot and the pin may not be releasable from the slot at a second point of travel of the pivot. The first link may include a first retaining lobe and the second link may include a second retaining lobe disposed to interlock with the first retaining lobe.

DETAILED DESCRIPTION

Figure 1:
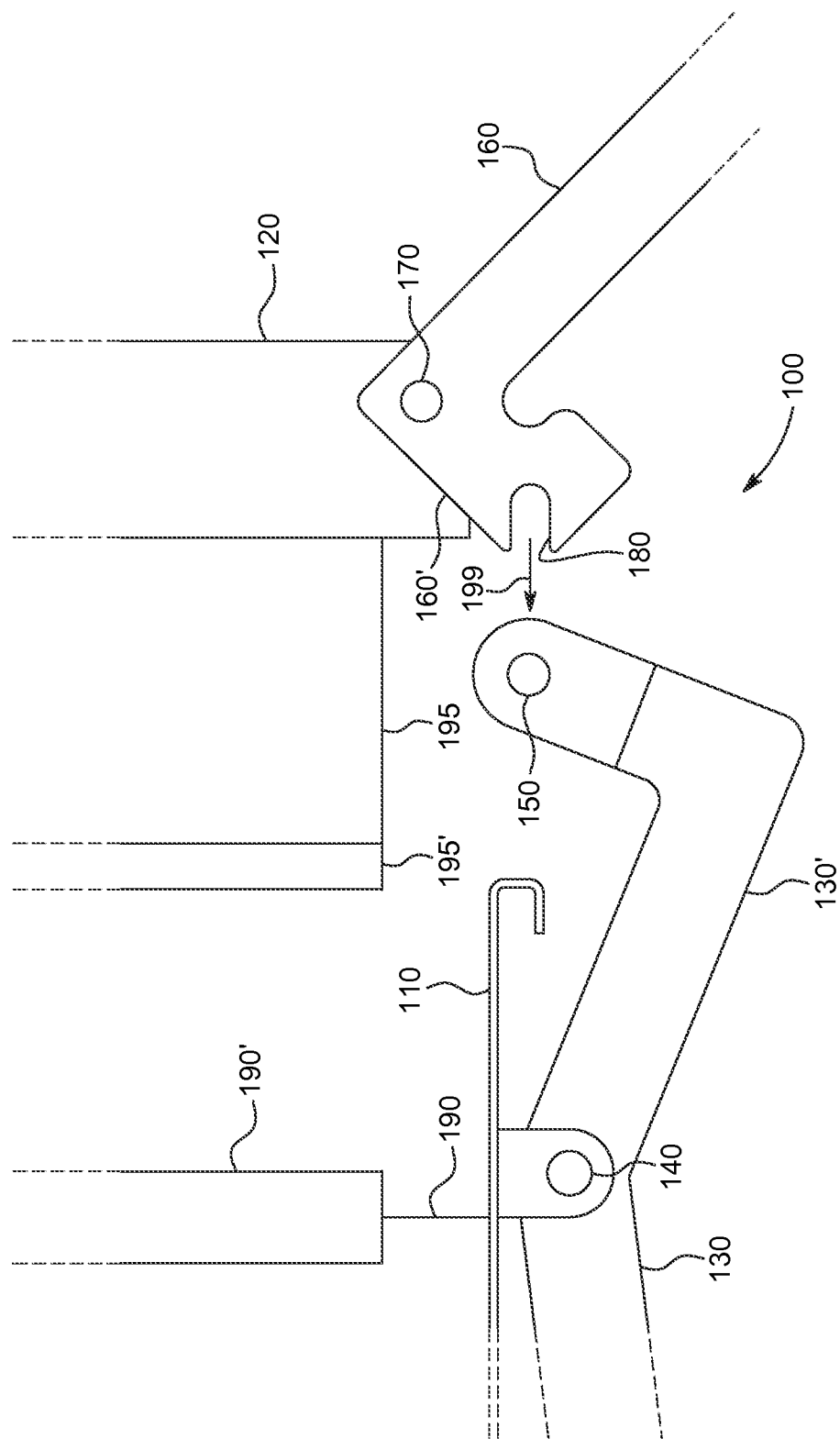
FIG. 1 is a side view of an example mechanism for connecting a chassis plate and a faceplate.

FIG. 1 illustrates an example mechanism 100 for connecting a chassis plate 110 and faceplate 120. Chassis plate 110 may be a part of a chassis, housing or cabinet holding a backplane or motherboard 190 for example, and faceplate 120 may be a carrier for or component of a circuit card, circuit pack, or daughterboard 195 for example. It is noted that mechanism 100 is not limited to these applications and may be used to connect other types of components.

In some implementations, a pin or edge connector 195' of the circuit card, circuit pack, or daughterboard 195 may be inserted into a counterpart pin or edge connector 190' of backplane or motherboard 190 as chassis plate 110 is connected with faceplate 120. It is noted that in some implementations other types of connections may be used, or that chassis plate 110 and faceplate 120 may be connected without such additional electrical or other connections.

Relative movement of the faceplate 120 and/or daughterboard 195 with respect to chassis plate 110 and/or motherboard 190 may be limited to single plane movement in the direction of arrow 199 by an insertion guide, slot, track, or other suitable structure (not shown) such that the components remain properly aligned for connection and can move slidably with respect to one another.

An arm 130 is attached to chassis plate 110 by a pivot 140. Arm 130 also includes a pivot pin 150 and a link 130' between pivot 140 and pivot pin 150. A lever 160 is attached to faceplate 120 by a pivot 170. Lever 160 also includes a pivot slot 180 and link 160' between pivot 170 and pivot slot 180. The components shown in FIG. 1 may move, slide, and pivot as appropriate in the plane of FIG. 1, and forces described herein may act on mechanism 100 in the plane of FIG. 1.

It is noted that in some implementations pivot 140 and/or pivot 170 may include a hinge, flexure bearing, living hinge, or other hinge or other suitable pivot mechanism.

Figure 2:
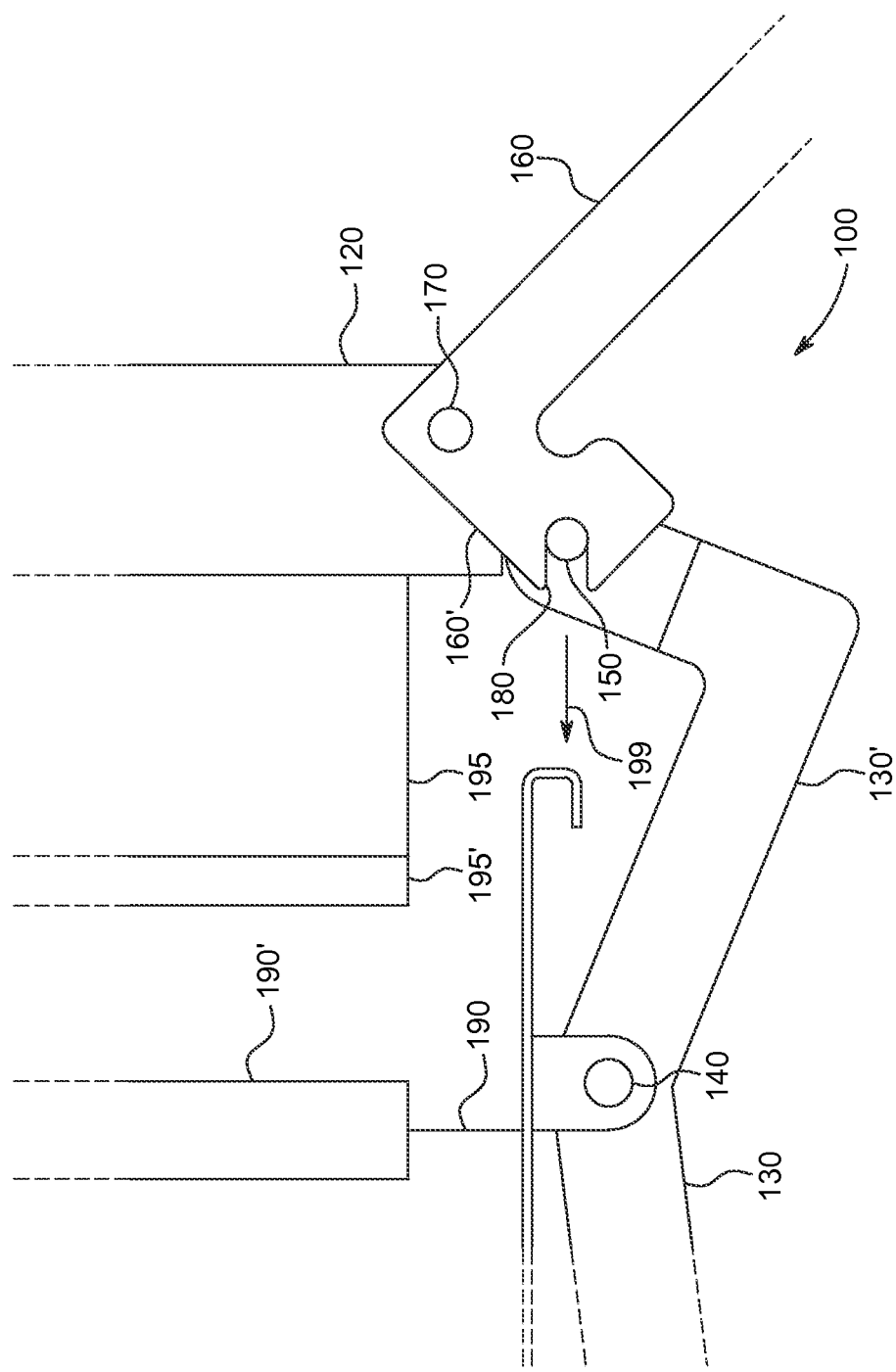
FIG. 2 is a side view of the example mechanism of FIG. 1 shown in another position.

FIG. 2 shows mechanism 100 in a position where faceplate 120 and daughterboard 195 have been moved toward chassis plate 110 and motherboard 190 in the direction of arrow 199 just to the point where pivot pin 150 seats in pivot slot 180. Lever 160 is shown in a full open position where the mechanism 100 is releasable, where pivot pin 150 may be removed from pivot slot 180, and where faceplate 120 remains removable from the chassis 110.

Figure 3:
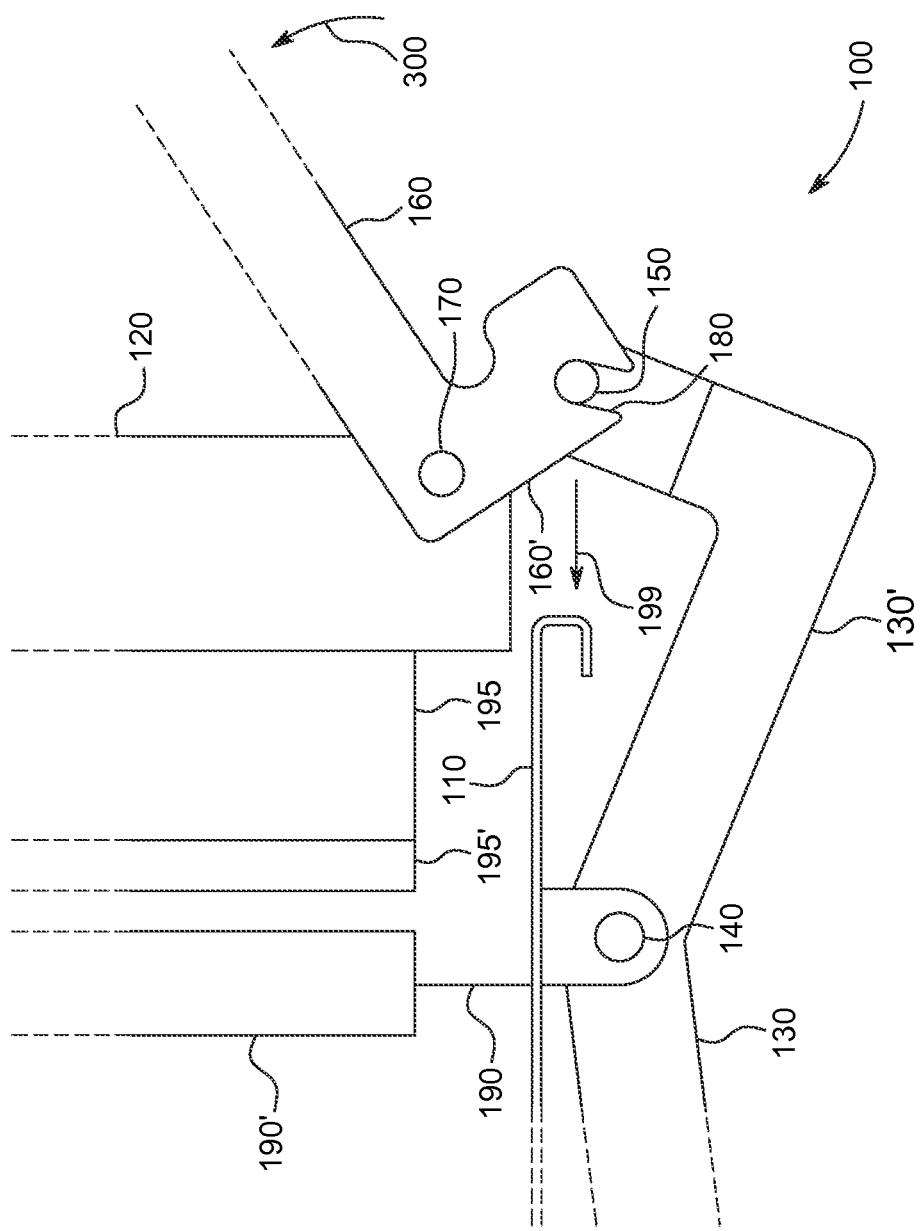
FIG. 3 is a side view of the example mechanism of FIGS. 1 and 2 shown in another position.

FIG. 3 shows mechanism 100 in a position where lever 160 has been partially rotated about pivot 170 in the direction of arrow 300 from the position shown in FIG. 2. The engagement of pivot pin 150 with pivot slot 180 connects lever 160 in a pivoting relationship with arm 130 such that the faceplate 120 is forced further toward chassis plate 110 in the direction of arrow 199 as lever 160 rotates in the direction of arrow 300. The action of lever 160 in the direction of arrow 300 to rotate link 160' about pivot 170 may be described as a crank which slidably moves chassis 110, which may be described as a slider, via link 130', which may be described as a connecting rod.

It is noted that in addition to the geometries of pivot pin 150 and pivot slot 180, additional components (omitted for clarity) support the engagement of pivot pin 150 and pivot slot 180 to prevent inadvertent disengagement as will be described further below. The engaged pivot pin 150 and pivot slot 180 are referred to herein as pivot 150/180.

Figure 4:
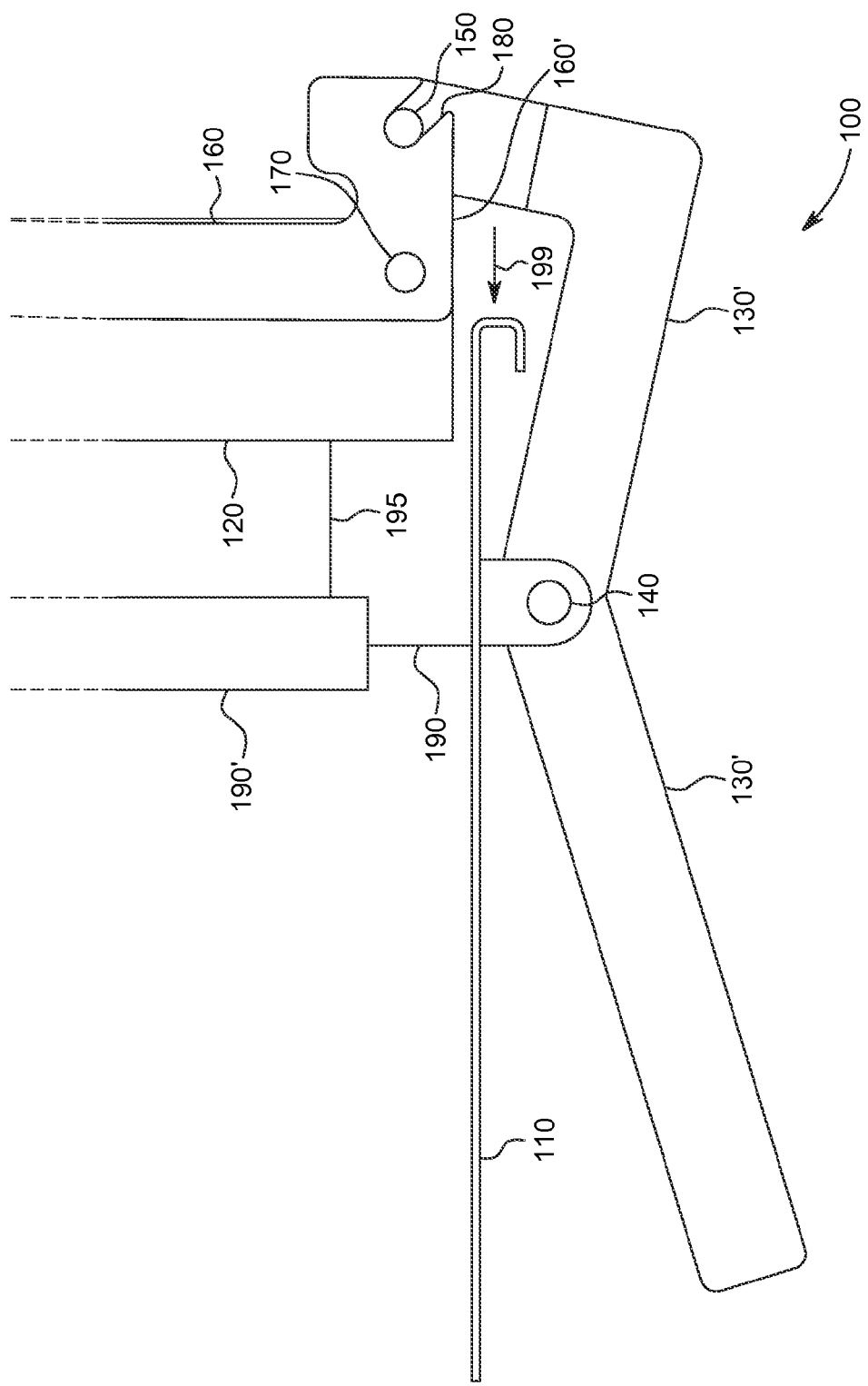
FIG. 4 is a side view of the example mechanism of FIGS. 1-3 shown in another position.

FIG. 4 shows mechanism 100 in a position where lever 160 has been rotated to its fullest extent in the direction of arrow 300 from the position shown in FIG. 2. Lever 160 may be prevented from moving any further in the direction of arrow 300 by faceplate 120 or by a stop such as a tab, detent, or other suitable feature (not shown). In this position, faceplate 120 has been forced to its fullest extent toward chassis plate 110 in the direction of arrow 199. In this example, pin or edge connector 195' of the circuit card, circuit pack, or daughterboard 195 is fully inserted into counterpart pin or edge connector 190' (not shown) of backplane or motherboard 190 as chassis plate 110 is fully connected with faceplate 120.

The progression of FIGS. 1-4 illustrates an operation of mechanism 100 which may have the advantage of permitting a large amount of force to be applied to connect faceplate 120 to chassis plate 110 and connectors 195' and 190' in a specific direction using a convenient mechanism and without causing unnecessary stress on the various components. This may be an advantage in overcoming frictional forces when assembling components having tight tolerances or electrical connectors having high pin counts.

Faceplate 120 and/or daughterboard 195 may be released from chassis plate 110 and motherboard 190 by manipulating lever 160 in the direction opposite to arrow 300 such that mechanism 100 operates in sequence from FIGS. 4-3-2-1.

Figure 5:
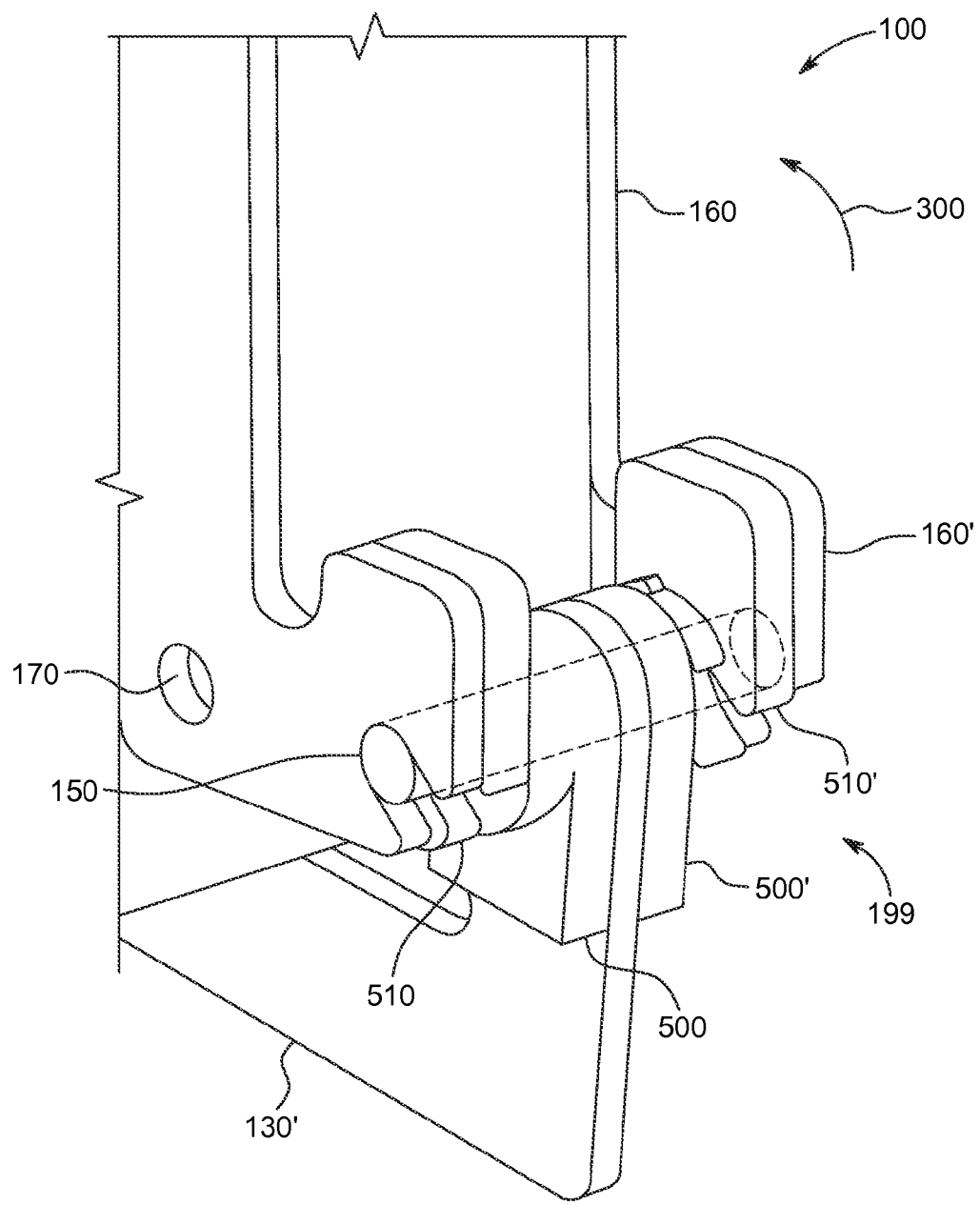
FIG. 5 is a perspective view of the example mechanism of FIGS. 1-4 in the position of FIG. 4 illustrating further components.

FIG. 5 is a perspective view of mechanism 100 in the position shown in FIG. 4, showing additional components which may prevent inadvertent disengagement of pivot pin 150 and pivot slot 180.

Elements 500 and 500' are affixed to or integral with link 130'. Elements 510 and 510' are affixed to or integral with link 160'. The geometry of elements 500, 500', 510, and 510', which will be described further herein, is such that in the position shown they are entangled or interlocked such that pivot pin 150 and pivot slot 180 cannot be separated and such that pin 150 and pivot slot 180 form a pivot 150/180 connecting link 130' to link 160'. This may have the advantage of enabling force to be applied to chassis plate 110, face plate 120, or other portions of mechanism 100 without disengaging pivot 150/180 or separating chassis plate 110 from face plate 120.

Figure 6:
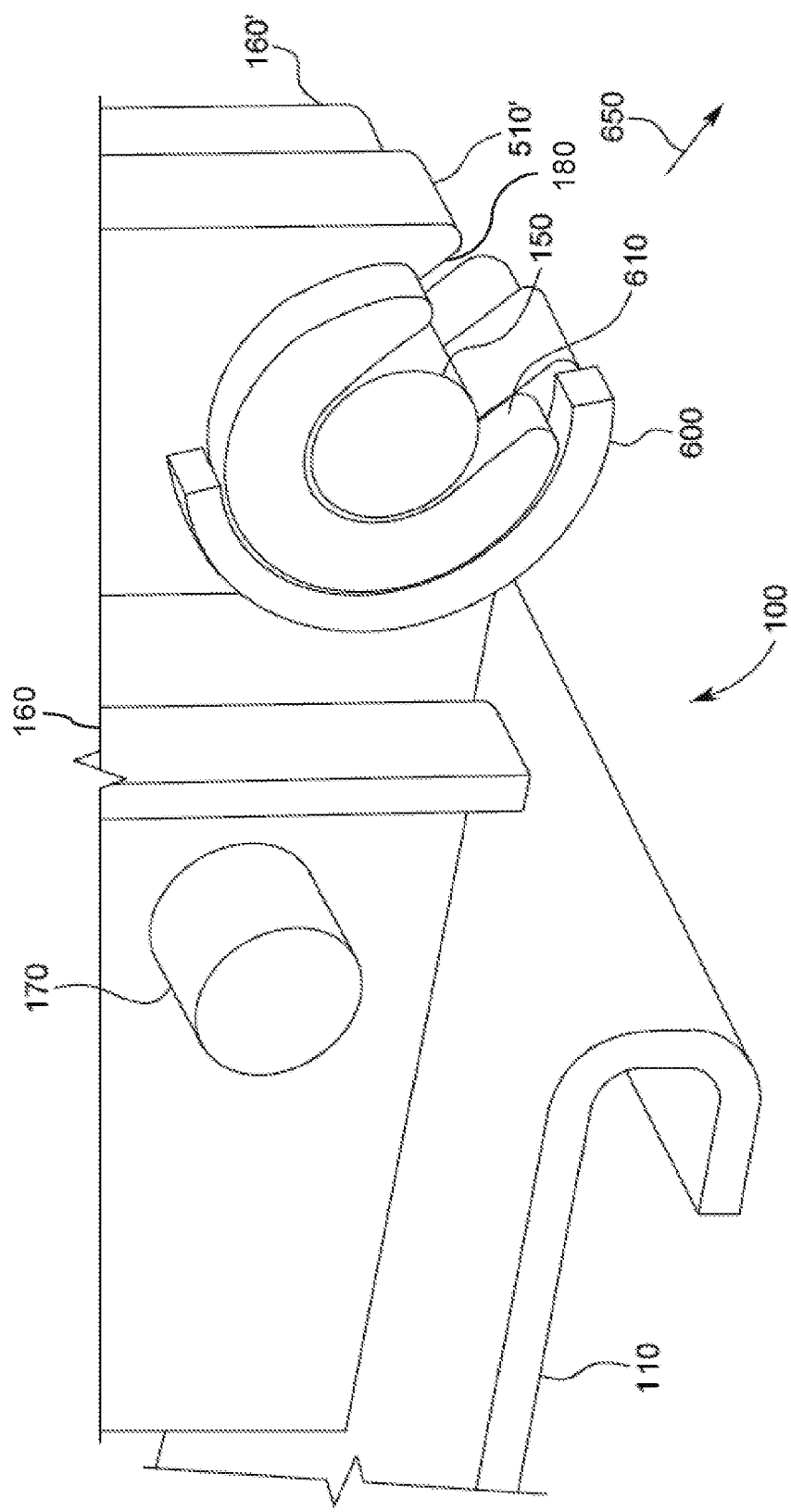
FIG. 6 is a partial cutaway perspective view of the example mechanism of FIGS. 1-5 in the position of FIGS. 4 and 5.

FIG. 6 is a sectional perspective view of mechanism 100 in the position of FIGS. 4 and 5, further illustrating lobes 600 and 610 of elements 500' and 510' respectively, as depicted in FIG. 5. Lobes 600 and 610 may be integral with elements 500' and element 510'.

In the position shown, the lobes 600 and 610 are entangled such that a force on pivot pin 150, or chassis plate 110, in the direction of arrow 650 for example, cannot separate pivot pin 150 from pivot slot 180. Pivot pin 150 is prevented from exiting pivot slot 180 in this position because lobe 610 of element 510' blocks lobe 600 of element 500; where lobe 600 is joined to or integral with pivot pin 150. When lobes 600 and 610 are entangled as shown, pivot pin 150 cannot be removed from pivot slot 180 except by rotating lever 160 until mechanism 100 is in a position where lobe 610 no longer blocks lobe 600. In various implementations, lobes 600 and 610 may be configured such that they are entangled throughout a desired portion of the range of travel of lever 160.

Figure 7:
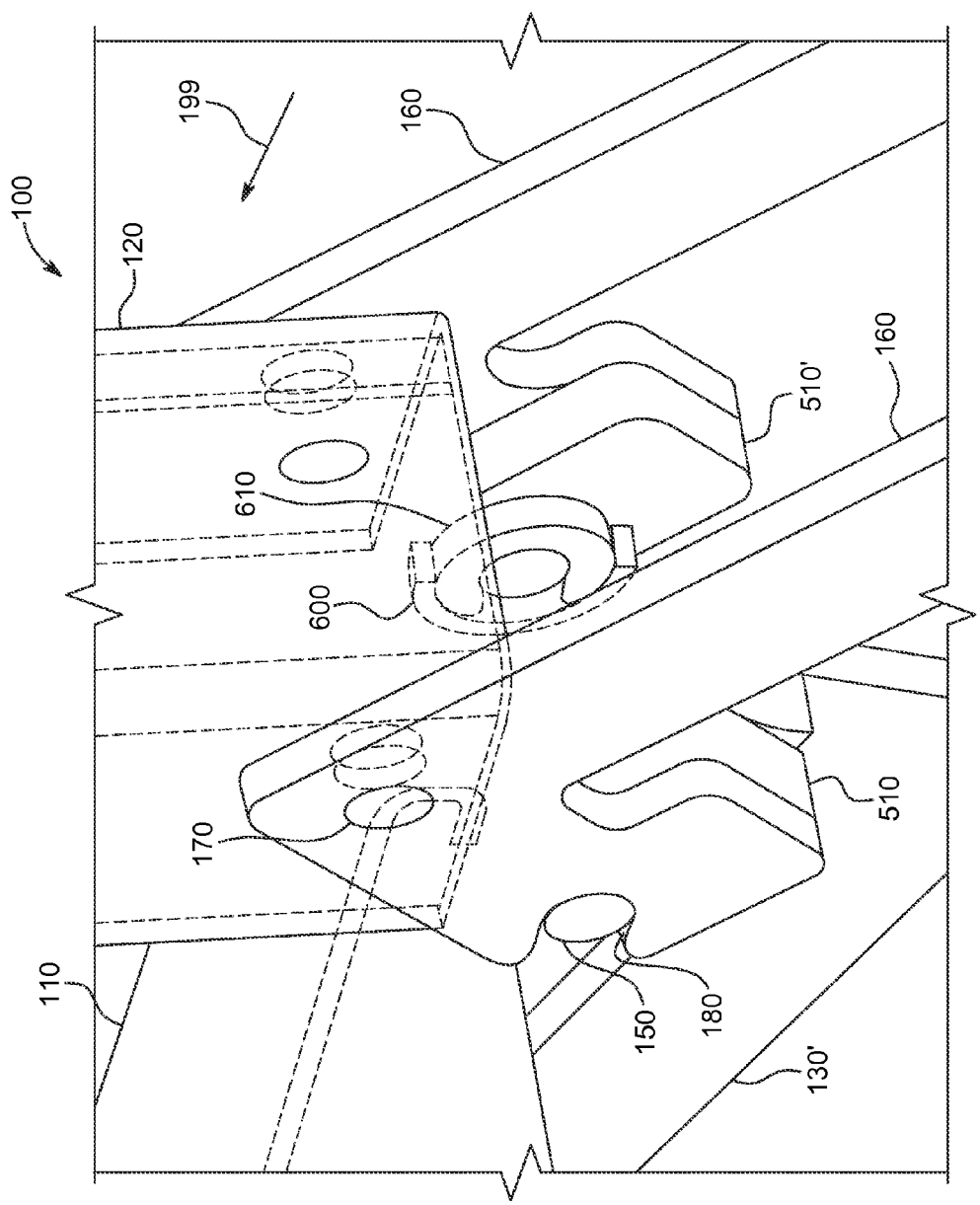
FIG. 7 is a partial cutaway perspective view of the example mechanism of FIGS. 1-6 shown in the position of FIG. 2.
Figure 8:
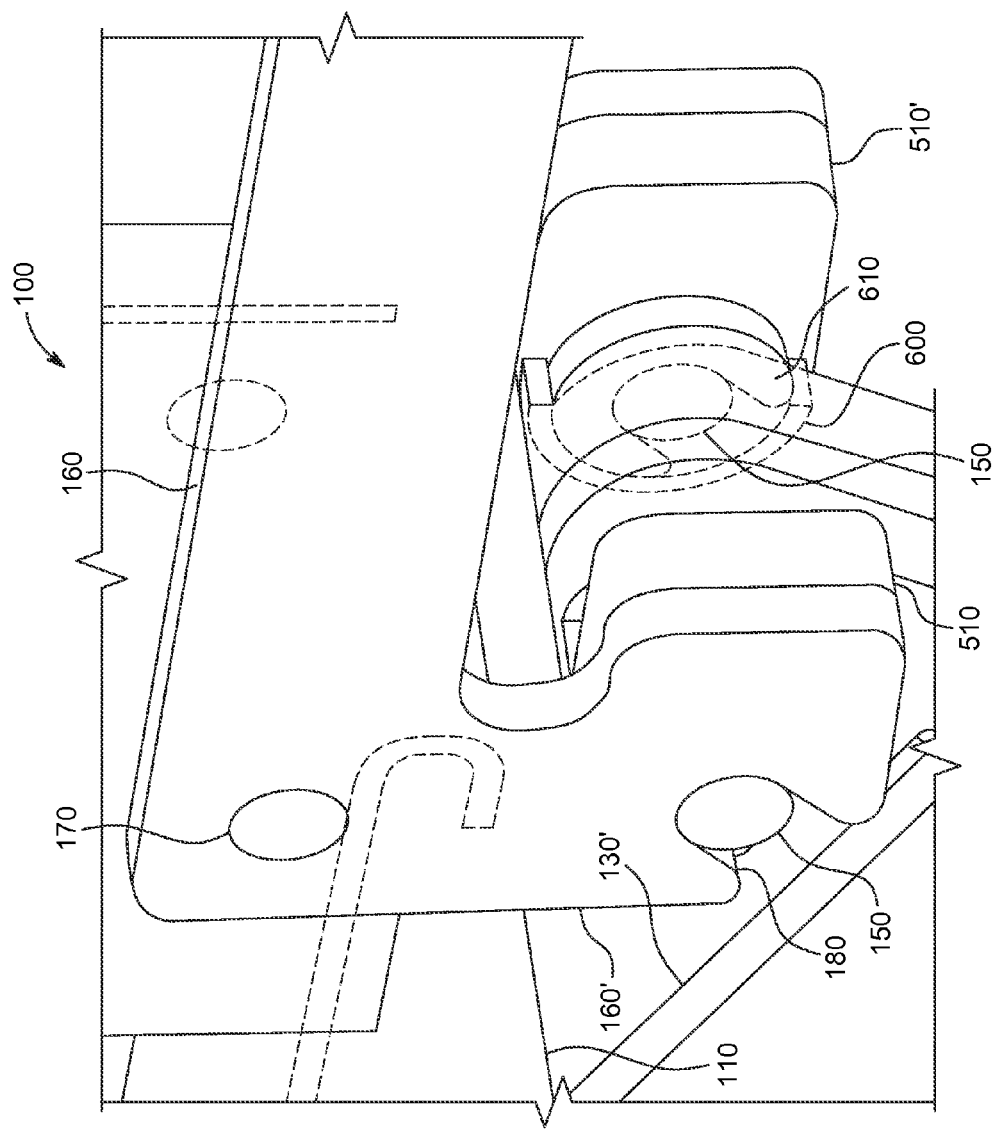
FIG. 8 is a partial cutaway perspective view of the example mechanism of FIGS. 1-7 shown in the position of FIG. 3.
Figure 9:
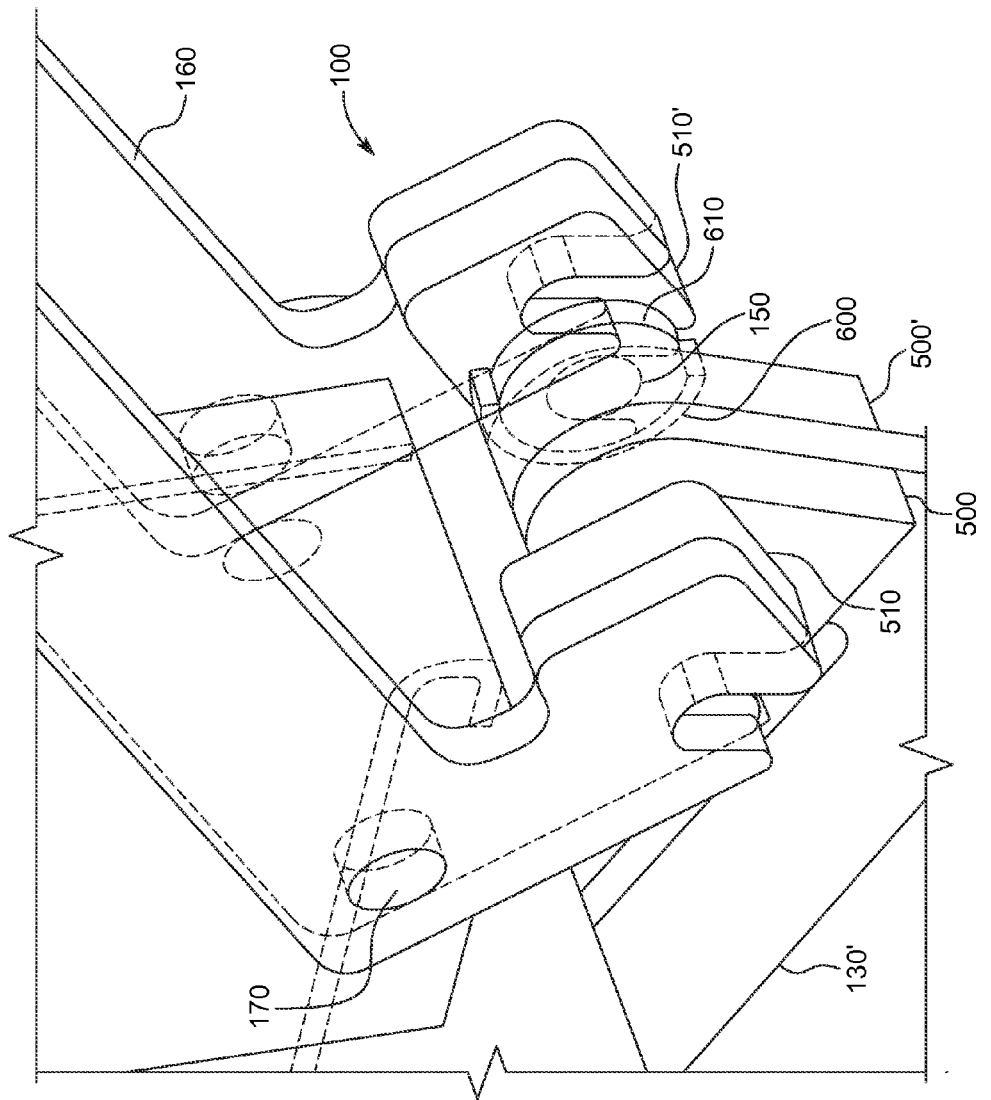
FIG. 9 is a partial cutaway perspective view of the example mechanism of FIGS. 1-8 shown in the position of FIG. 4.

FIGS. 7-9 are perspective views of mechanism 100 which further illustrate the entanglement of lobes 600 and 610. FIG. 7 corresponds to the position of FIG. 2, FIG. 9 corresponds to the position of FIG. 3, and FIG. 9 corresponds to a position of mechanism 100 between that shown in FIGS. 2 and 3.

In FIG. 7, pivot pin 150 may be removed from pivot slot 180 without rotation of lever 160 because lobe 610 does not block lobe 600 in this position. In FIGS. 8 and 9, pivot pin 150 cannot be removed from pivot slot 180 without rotating lever 160 to the position of FIG. 7 because lobe 610 blocks lobe 600 in these positions. FIG. 5, further described above, corresponds to the position of mechanism 100 shown in FIG. 4 and shows mechanism 100 in a position where lever 160 has been rotated to its fullest extent in the direction of arrow 300. In this position, faceplate 120 has been drawn to its fullest extent toward chassis plate in the direction of arrow 199 and pivot pin 150 cannot be removed from pivot slot 180 without rotating lever 160 to the position of FIG. 7 because lobe 610 blocks lobe 600 in these positions, as in FIGS. 8 and 9.

Figure 10A:
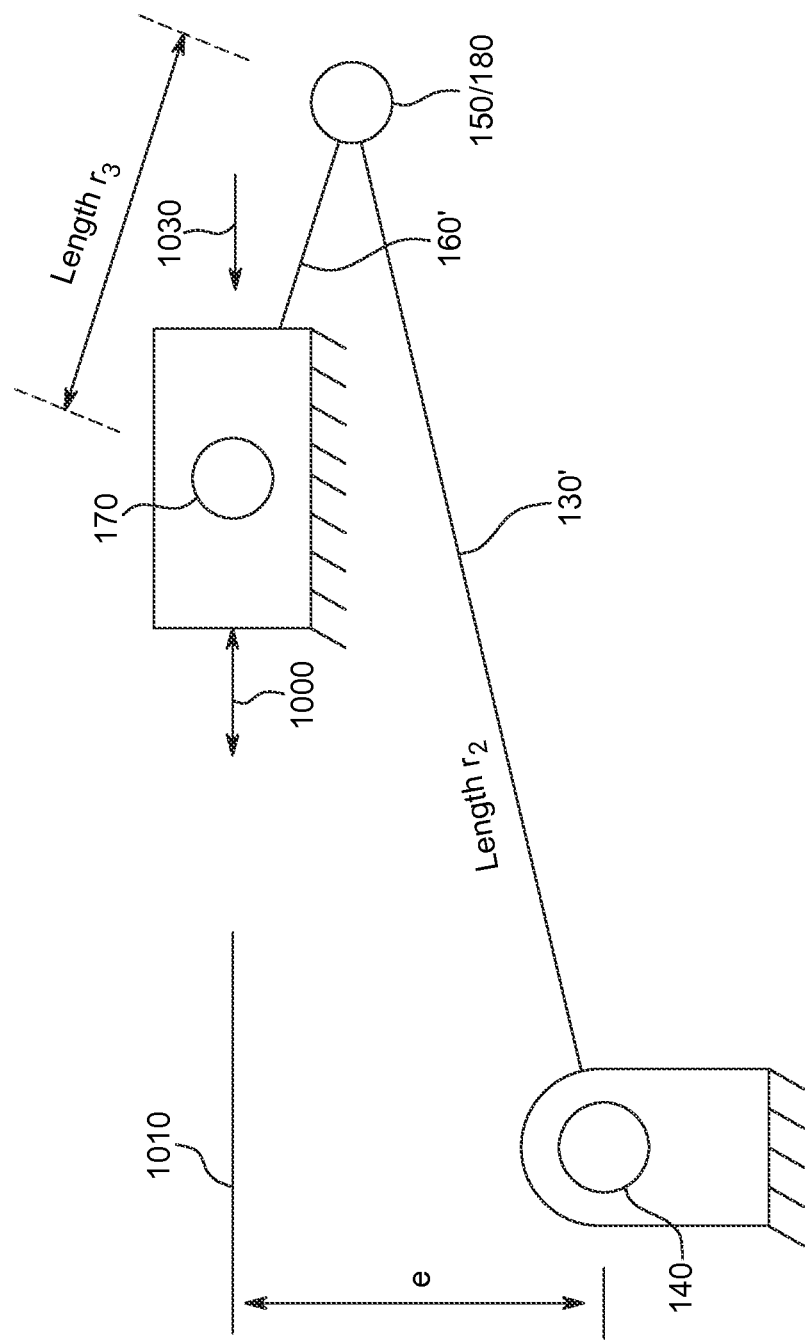
FIGS. 10A and 10B are diagrams illustrating forces within the mechanism of FIGS. 1-9.
Figure 10B:
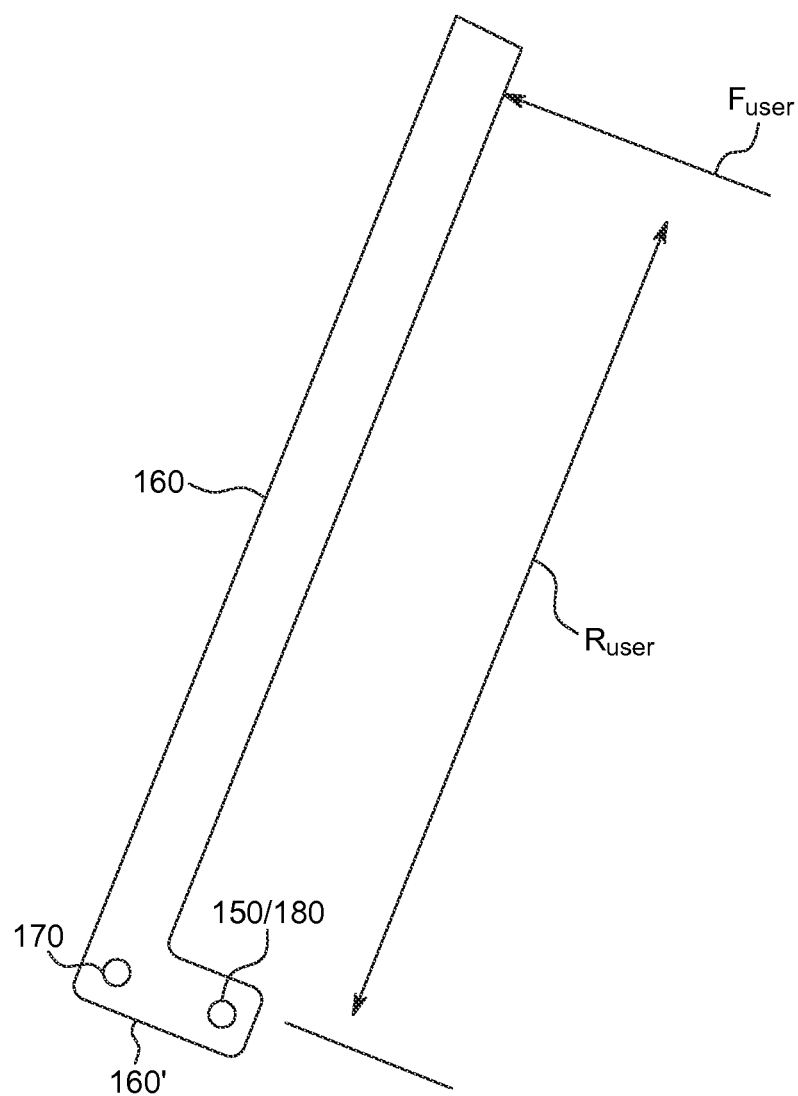

FIGS. 10A and 10B are diagrams illustrating forces and dimensions within mechanism 100. In FIG. 10A, pivot 140 is represented as a fixed pivot, pivot 150/180 is represented as movable within the plane of FIGS. 10A and 10B, and pivot 170 is represented as a sliding pivot which may slide in either direction of arrow 1000.

Pivot 170 may be constrained to move only in the directions of arrow 1000 by an insertion guide, slot, track, or other similar feature (not shown) such that a distance "e" between pivot 140 and a plane of travel 1010 of pivot 170 is fixed. Link 130' has a length "r2" between pivot 140 and pivot 150. Link 160' has a length "r3" between pivot 170 and pivot 150.

FIG. 10B illustrates a net force "$F_{user}$" applied to lever 160 and link 160'. It is noted that net force $F_{user}$ may be applied to link 160, for example, by a user operating mechanism 100. Net force $F_{user}$ is represented as applied at a distance "$R_{user}$" from pivot 170.

By applying net force $F_{user}$ to link 160, pivot 170 (and thus faceplate 120) is forced in the direction of arrow 1000 along plane 1010 with a force 1030 that depends upon the values of e, r2, r3, $R_{user}$, and $F_{user}$.

Figure 11:
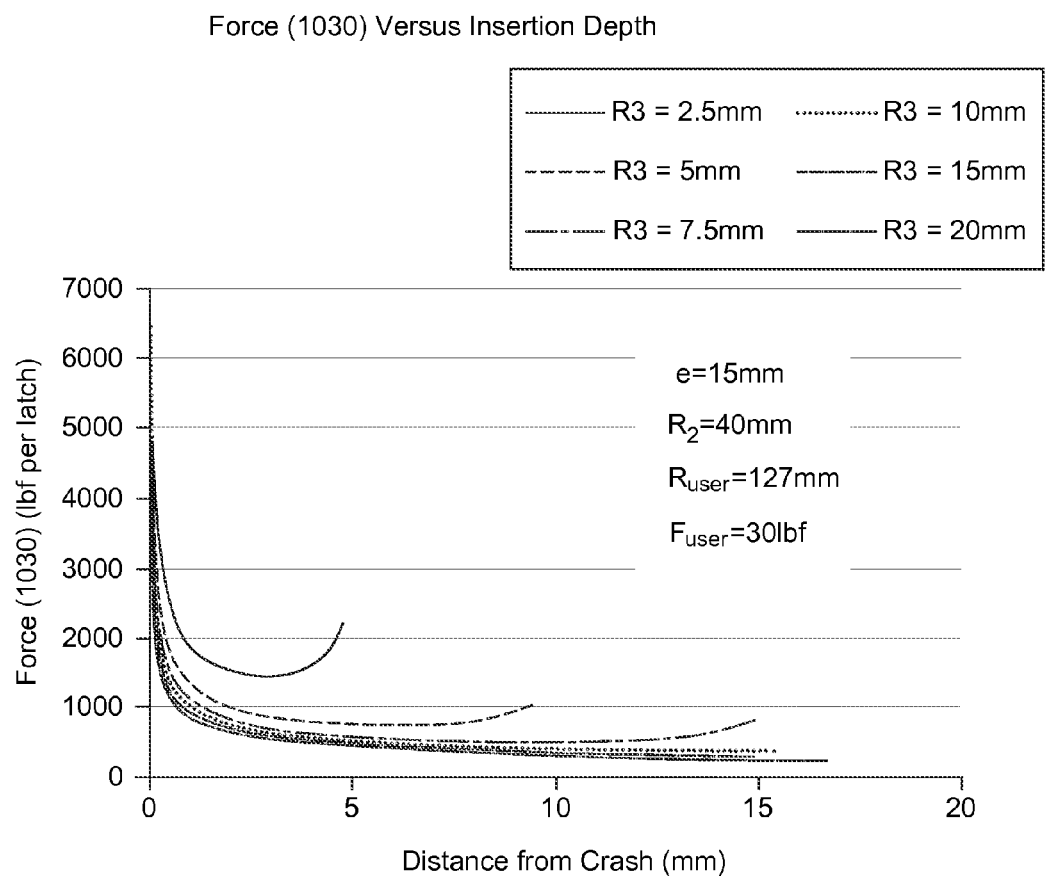
FIG. 11 is a chart illustrating forces within the mechanism of FIGS. 1-10.

FIG. 11 is a chart illustrating the dependence of force 1030 upon e, r2, R3, Ruser, and Fuser. Force 1030 is shown as a function of distance from crash, i.e. distance from the fully latched position of chassis plate 110 and faceplate 120 (such as shown in FIGS. 4, 5, and 6). In FIG. 11, Force 1030 is illustrated for several example values of R3 where values for e, r2, $R_{user}$, and $F_{user}$ are fixed. In this example, e=15 mm, r2=40 mm, Ruser=127 mm, $F_{user}$=30 lbf, and r3 is shown for values of 2.5 mm, 5 mm, 7.5 mm, 10 mm, 15 mm, and 20 mm. It is noted that any or all of these values may be varied as appropriate to alter the function of distance from crash upon which force 1030 depends.

In some implementations mechanism 100 may thus provide a substantial and increasing force as the distance from crash closes, which may have the advantage of enabling chassis plate 110 to seat firmly to faceplate 120. This may also have the advantage of providing a force adequate to seat edge or pin connectors attached to chassis plate 110 and face plate 120, where the dimensions of mechanism 100 may be selected to provide a force adequate to overcome the friction produced by large pin count connectors, for example.

Figure 12:
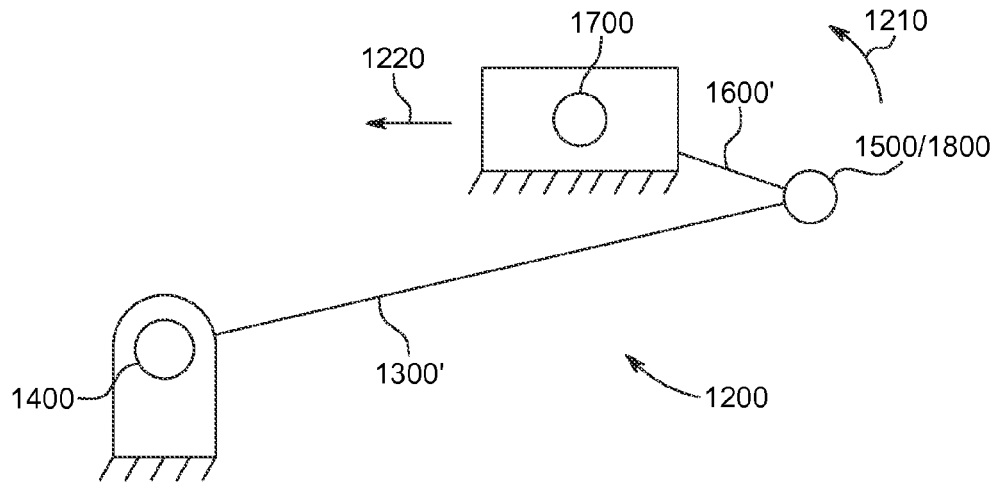
FIG. 12 is a diagram illustrating forces within a mechanism similar to the mechanism of FIGS. 1-11 and configured to be self-retaining.
Figure 13:
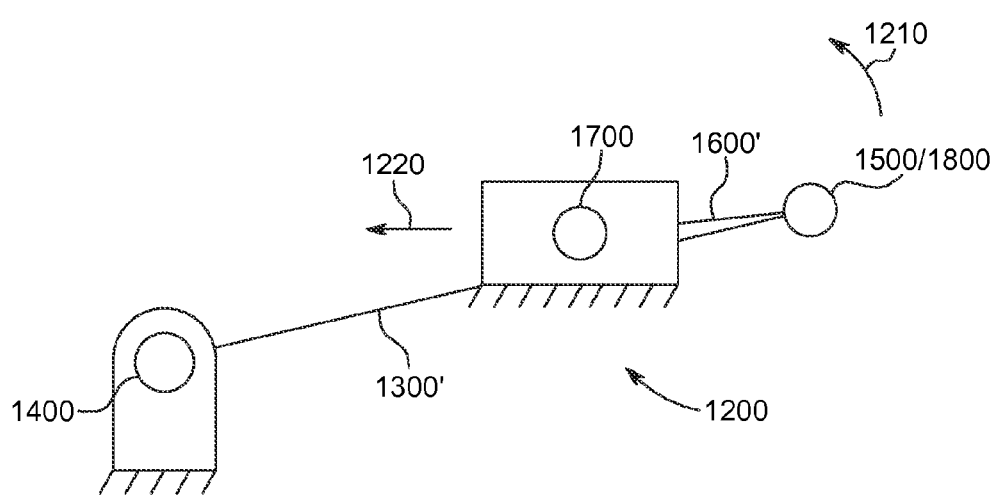
FIG. 13 is another diagram illustrating forces within the mechanism of FIG. 12 shown in another position.
Figure 14:
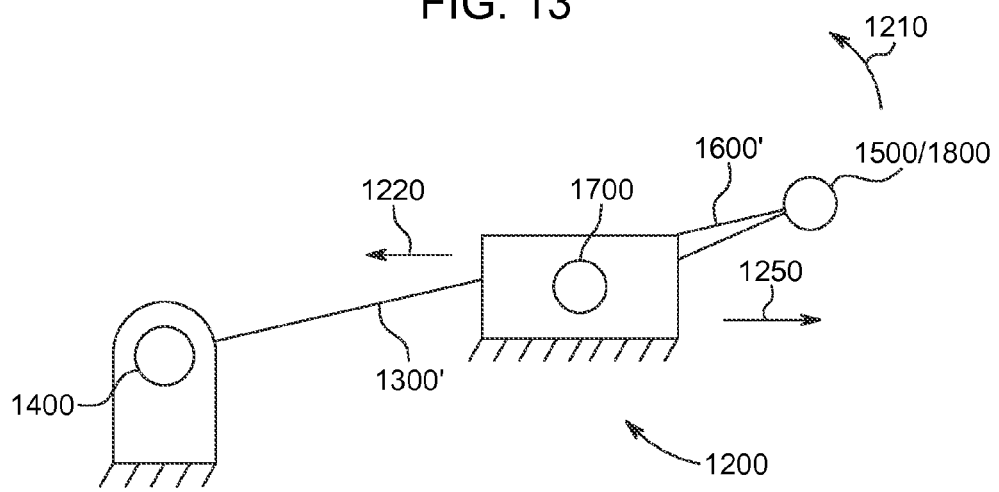
FIG. 14 is another diagram illustrating forces within the mechanism of FIGS. 12 and 13 shown in another position.

FIGS. 12, 13, and 14 are force diagrams illustrating an example mechanism 1200 in progression from a "pre-latched" position in FIG. 12 to a "post-latched" position in FIG. 14 as a force 1210 is applied to link 1600' causing link 1600' to rotate about pivot 1700 and causing pivot 1700 to slide in the direction of arrow 1220. Force 1210 may be applied using a lever (not shown).

Mechanism 1200 may include all components of mechanism 100 described above, except in that the dimensions of mechanism 1200 are such that mechanism 1200 is "self-retaining" in the post-latched position shown in FIG. 14.

FIG. 12 illustrates mechanism 1200 in a "pre-latched" position similar to the position of mechanism 100 shown in FIG. 3. In this position prior to latching, the net force 1210 applied to link 1600' may cause pivot 1700 to slide in the direction of arrow 1220. FIG. 13 illustrates mechanism 1200 in a position approaching a "latch-up" position of the mechanism beyond which mechanism 1200 is self-retaining in the final latched position. Here, net force 1210 applied to pivot 1700 may also cause pivot 170 to slide in the direction of arrow 1220. FIG. 14 illustrates mechanism 1200 in a position past the latch-up point. This position of mechanism 1200 is comparable to the position of mechanism 100 shown in FIG. 4, except in that the relative position of pivot 1500/1800 results in retention of mechanism 1200 in this position. Here, a force a 1250 will not cause pivot 1700 to slide in the direction of arrow 1220 because rotation of pivot 1500/1800 in the direction of net force 1210 is stopped at its furthest point of rotation. It is noted that when mechanism 1200 is in the fully latched position shown in FIG. 14, rotation of pivot 1500/1800 in the direction of net force 1210 may be opposed by contact of link 1600' on an object to which pivot 1700 is attached, such as a faceplate, (not shown) or another suitable feature or mechanism such as a stop, tab, detent, or otherwise (not shown).

Figure 15:
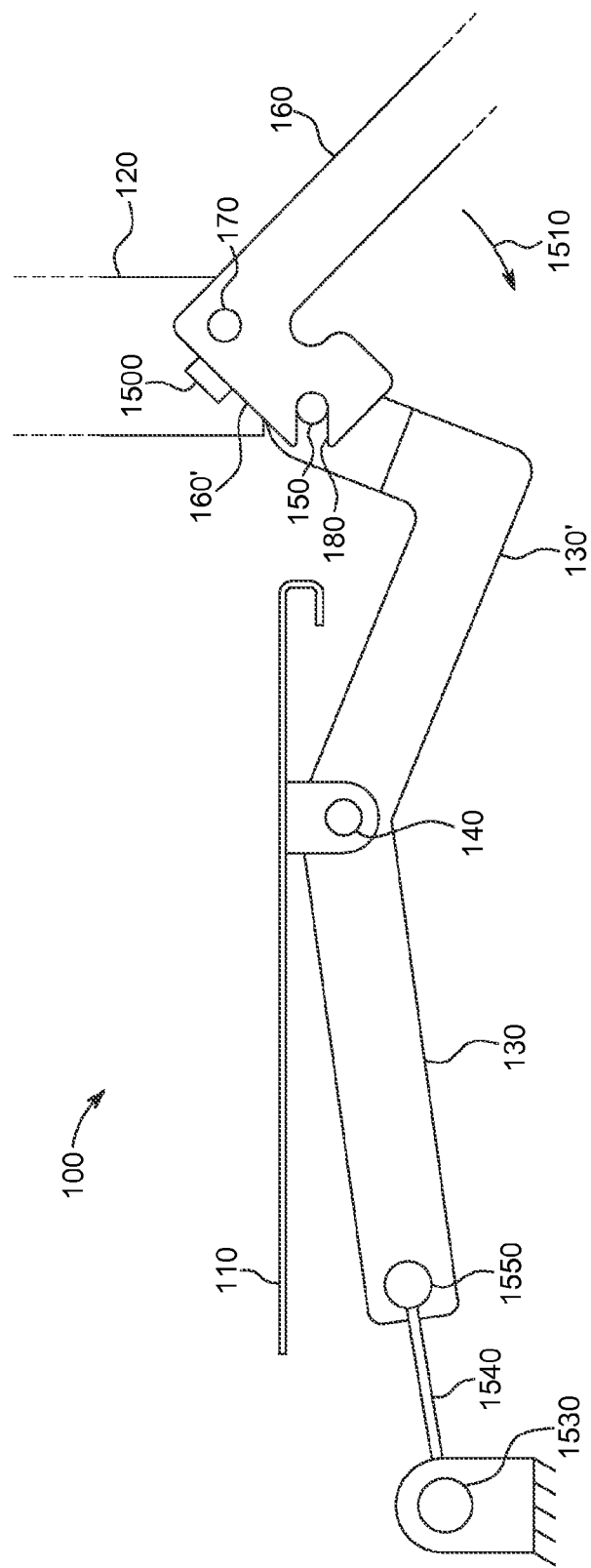
FIG. 15 is a side view of the mechanism of FIGS. 1-11 illustrating further components.

FIG. 15 is a side view of mechanism 100 featuring additional components and omitting some components for clarity. Stop 1500 is disposed on faceplate 120 to prevent rotation of lever 160 and link 160' in the direction of arrow 1510 beyond the fully unlatched position shown. Arm 130 is attached to a fixed pivot 1530 by a an elastic device 1540 such as a spring and pivot 1550 to bias arm 130 and link 130' to return to the unlatched position shown. These features may have the advantage of aligning pivot pin 150 with pivot 180 for convenient assembly of pivot 150/180.

Although features and elements are described above in particular combinations, one of ordinary skill in the art may appreciate that each feature or element may be used alone or in any combination with the other features and elements.

What is claimed is:

1. A mechanism for connecting a first object to a second object comprising:
    a first link connected to the first object;
    a second link connected to the second object;
    a slot disposed on the second link;
    a pin disposed on the first link and releasably connectable to the slot to form a pivot connecting the first link to the second link;
    an elastic device disposed to bias the first link to a default position;
    wherein the pin is releasable from the slot at a first point of travel of the pivot;
    wherein the pin is not releasable from the slot at a second point of travel of the pivot;
    wherein the first link is located between a first link pivot and the pin, and comprises a first retaining lobe partially surrounding the pin, and the second link is located between a second link pivot and the slot, and comprises a second retaining lobe disposed to interlock with the first retaining lobe;
    wherein the first link pivot connects the first link to the first object, and the second link pivot connects the second link to the second object;
    wherein the first retaining lobe is disposed to interlock with the second retaining lobe at the second point of travel; and
    wherein the second retaining lobe is disposed to partially surround the pin at the second point of travel.

2. The mechanism of claim 1, wherein the first link is connected to the first object by the first link pivot and the second link is connected to the second object by the second link pivot.

3. The mechanism of claim 2, wherein the first object and the second object are forceable together by a latching mechanism on a condition that the slot is connected to the pin and the first link is pivoted about the first link pivot in a first direction.

4. The mechanism of claim 2, further comprising a lever disposed on the second link and configured to pivot the second link about the second link pivot on a condition that a first force is applied to the lever.

5. The mechanism of claim 1, wherein the pin is releasable from the slot on a condition that the pivot is within a first range of travel and wherein the pin is not releasable from the slot on a condition that the pivot is within a second range of travel.

6. The mechanism of claim 1, wherein the pivot is pivotable between an unlatched position and a latched position.

7. The mechanism of claim 6, wherein the mechanism is self-retaining on a condition that the pivot is in the latched position.

8. The mechanism of claim 6, wherein the pivot is pivotable only between the unlatched position and the latched position.

9. The mechanism of claim 1, further comprising a stop disposed to limit a range of motion of the second link.

10. The mechanism of claim 1, wherein the first object comprises an electrical connector and the second object comprises a counterpart electrical connector disposed to connect with the electrical connector.

11. The mechanism of claim 1, wherein the first link is connected to the first object by a first connector, wherein the first connector comprises a pivot, a flexure bearing, or a living hinge; and the second link is connected to the second object by a second connector, wherein the second connector comprises a pivot, a flexure bearing, or a living hinge.

12. A method for connecting a first object to a second object comprising:
    connecting a first link to the first object;
    connecting a second link to the second object;

disposing a slot on the second link;

disposing a pin on the first link which is releasably connectable to the slot to form a pivot connecting the first link to the second link;

disposing an elastic device to bias the first link to a default position wherein the pin is releasable from the slot at a first point of travel of the pivot;

wherein the pin is not releasable from the slot at a second point of travel of the pivot;

wherein the first link is located between a first link pivot and the pin, and comprises a first retaining lobe partially surrounding the pin and the second link is located between a second link pivot and the slot, and comprises a second retaining lobe disposed to interlock with the first retaining lobe;

wherein the first link pivot connects the first link to the first object, and the second link pivot connects the second link to the second object;

wherein the first retaining lobe is disposed to interlock with the second retaining lobe at the second point of travel; and wherein the second retaining lobe is disposed to partially surround the pin at the second point of travel.

13. The method of claim 12, wherein the first link is connected to the first object by the first link pivot and the second link is connected to the second object by the second link pivot.

14. The method of claim 13, wherein the first object and the second object are forceable together by a latching mechanism on a condition that the slot is connected to the pin and the first link is pivoted about the first link pivot in a first direction.

15. The method of claim 13, further comprising a lever disposed on the second link and configured to pivot the second link about the second link pivot on a condition that a first force is applied to the lever.

16. The method of claim 12, wherein the pin is releasable from the slot on a condition that the pivot is within a first range of travel and wherein the pin is not releasable from the slot on a condition that the pivot is within a second range of travel.

17. The method of claim 12, wherein the pivot is pivotable between an unlatched position and a latched position.

18. The method of claim 17, wherein the pivot is self-retaining on a condition that the pivot is in the latched position.

19. The method of claim 17, wherein the pivot is pivotable only between the unlatched position and the latched position.

20. The method of claim 12, further comprising disposing a stop to limit a range of motion of the second link.

21. The method of claim 12, wherein the first object comprises an electrical connector and the second object comprises a counterpart electrical connector disposed to connect with the electrical connector.

22. The method of claim 12, wherein the first link is connected to the first object by a first connector, wherein the first connector comprises a pivot, a flexure bearing, or a living hinge; and the second link is connected to the second object by a second connector, wherein the second connector comprises a pivot, a flexure bearing, or a living hinge.

23. A crank-and-slider mechanism for forcing a first object toward a second object comprising:

a crank connected to the first object;

a connecting rod connected to the second object;

an elastic device disposed to bias the crank to a default position;

wherein the connecting rod is connectable to the crank by a pivot;

wherein the first object and the second object are slidably connectable on a condition that the connecting rod is connected to the crank and the crank is rotated;

wherein the crank is located between a crank pivot and the pivot and comprises a first retaining lobe;

wherein the connecting rod is located between a connecting rod pivot and the pivot and comprises a second retaining lobe disposed to interlock with the first retaining lobe;

wherein the crank pivot connects the crank to the first object, and the connecting rod pivot connects the connecting rod to the second object;

wherein the pivot is separable at a first point of travel of the pivot; and wherein the pivot is not separable at a second point of travel of the pivot;

wherein the first retaining lobe partially surrounds the pivot; and wherein the second retaining lobe is disposed to partially surround the pivot at the second point of travel.

* * * * *